(12) United States Patent
Lu

(10) Patent No.: US 12,341,276 B2
(45) Date of Patent: Jun. 24, 2025

(54) MEMORY MODULE CONNECTOR

(71) Applicant: Intel Corporation, Santa Clara, CA (US)

(72) Inventor: Wei Lu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 468 days.

(21) Appl. No.: 17/593,758

(22) PCT Filed: May 9, 2019

(86) PCT No.: PCT/CN2019/086141
§ 371 (c)(1),
(2) Date: Sep. 24, 2021

(87) PCT Pub. No.: WO2020/223947
PCT Pub. Date: Nov. 12, 2020

(65) Prior Publication Data
US 2022/0190498 A1     Jun. 16, 2022

(51) Int. Cl.
*H01R 12/72*     (2011.01)
*H01R 12/70*     (2011.01)
(Continued)

(52) U.S. Cl.
CPC ....... *H01R 12/7023* (2013.01); *H01R 12/716* (2013.01); *H01R 12/721* (2013.01); *G11C 5/06* (2013.01)

(58) Field of Classification Search
CPC .......................... H01R 12/7023; H01R 12/716; H01R 12/721; H01R 12/7029; G11C 5/06
See application file for complete search history.

(56) References Cited

U.S. PATENT DOCUMENTS 6,663,406 B1 * 12/2003 Wu ..................... H01R 12/7029
439/570
2003/0203679 A1 * 10/2003 Bu ....................... H01R 12/721
439/637

(Continued)

FOREIGN PATENT DOCUMENTS

CN         1254209 A     5/2000
CN       101740935 A     6/2010
(Continued)

*Primary Examiner* — Abdullah A Riyami
*Assistant Examiner* — Nelson R. Burgos-Guntin
(74) *Attorney, Agent, or Firm* — 2SPL Patent Attorneys PartG mbB; Yong Beom Hwang

(57) ABSTRACT

An electrical connector for connecting a circuit card to a substrate. The connector includes a housing and forklocks. The housing is in an elongated shape and includes a slot for accepting an edge of the circuit card. The forklocks are extended from a bottom surface of the housing on each end of the housing. The forklocks are inserted into through holes formed in the substrate to secure the housing to the substrate. The forklocks are rotated by a predetermined degree of angle (e.g. 45 degrees) about a longitudinal direction of the housing. The circuit card may be a memory module, such as a dual in-line memory module, and the substrate may be a printed circuit board. The circuit card may be a daughter board and the substrate may be a mother board.

9 Claims, 8 Drawing Sheets

(51) Int. Cl.
   *H01R 12/71*   (2011.01)
   *G11C 5/06*   (2006.01)

(56) References Cited

U.S. PATENT DOCUMENTS

| | | | | |
|---|---|---|---|---|
| 2008/0102700 A1* | 5/2008 | Beaman | | H01R 43/18 |
| | | | | 439/607.05 |
| 2009/0298303 A1* | 12/2009 | Vrenna | | H01R 12/716 |
| | | | | 439/55 |
| 2010/0128447 A1* | 5/2010 | MacDougall | | G11C 5/04 |
| | | | | 439/62 |
| 2012/0244734 A1* | 9/2012 | Fu | | H01R 13/648 |
| | | | | 439/637 |
| 2014/0099815 A1* | 4/2014 | Foster, Sr. | | H01R 12/721 |
| | | | | 439/327 |
| 2015/0024622 A1* | 1/2015 | Jin | | H01R 12/7029 |
| | | | | 439/355 |
| 2017/0069988 A1* | 3/2017 | Ouyang | | H01R 13/71 |
| 2018/0069334 A1* | 3/2018 | Li | | H01R 12/716 |
| 2019/0296462 A1* | 9/2019 | Li | | H01R 12/721 |
| 2023/0120108 A1* | 4/2023 | Fan | | H01R 12/7005 |
| | | | | 439/629 |
| 2023/0163500 A1* | 5/2023 | Yang | | H01R 12/721 |
| | | | | 439/59 |
| 2023/0335931 A1* | 10/2023 | He | | H01R 12/721 |
| 2024/0072467 A1* | 2/2024 | Yang | | H01R 12/7023 |
| 2024/0072468 A1* | 2/2024 | Yang | | H01R 12/721 |

FOREIGN PATENT DOCUMENTS

| | | |
|---|---|---|
| CN | 103201913 A | 7/2013 |
| EP | 0987792 A2 | 3/2000 |

\* cited by examiner

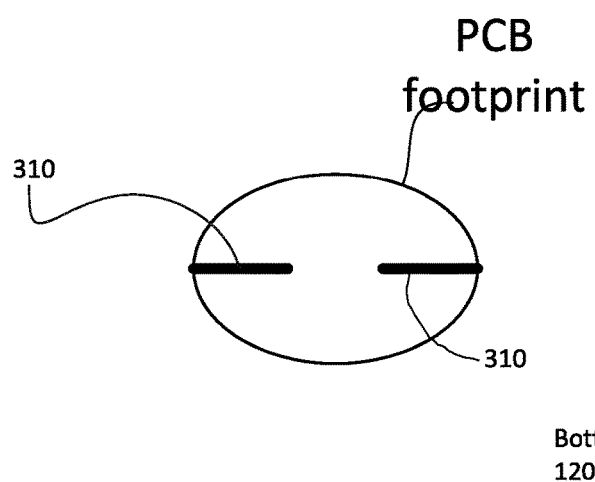
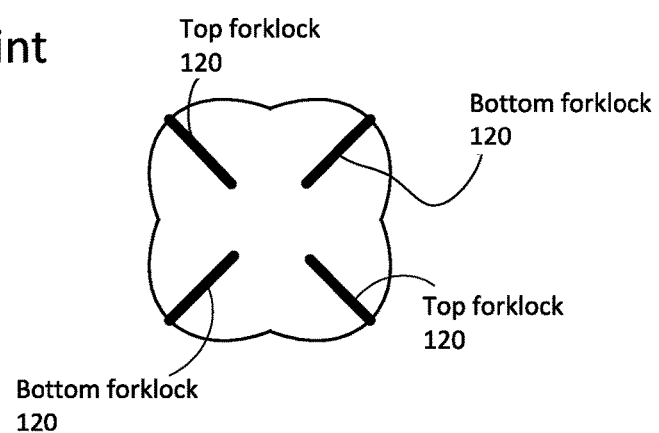
FIG. 7A                    FIG. 7B

MEMORY MODULE CONNECTOR

FIELD

Examples relate to an electrical connector for connecting a circuit card to a substrate, more particularly a memory module connector for connecting a memory module to a printed circuit board (PCB).

BACKGROUND

A memory module, such as a dual in-line memory module (DIMM) or a single in-line memory module (SIMM), includes a series of memory chips (e.g. dynamic random-access memory chips) on a circuit board. The memory modules are mounted to a PCB, such as a motherboard, via a connector (also referred to as a "socket"). A connector is installed on a PCB and a memory module is inserted into the connector. The connector enables interconnection between a memory module and a circuit on a PCB.

Placement of memory modules (e.g. DIMMs) on a PCB is a challenge in high density system design. In order to increase the density of a system, memory modules may be placed on both sides of a PCB. However, due to the conflicts of forklocks of a connector, top and bottom memory modules may not be mirror-placed.

BRIEF DESCRIPTION OF THE FIGURES

Some examples of apparatuses and/or methods will be described in the following by way of example only, and with reference to the accompanying figures, in which

FIG. 7A illustrates a footprint of a forklock of a conventional connector installed on one side of a PCB;

FIG. 7B shows a footprint of forklocks of connectors installed on both sides of a PCB at the same location.

DETAILED DESCRIPTION

Figure 1:
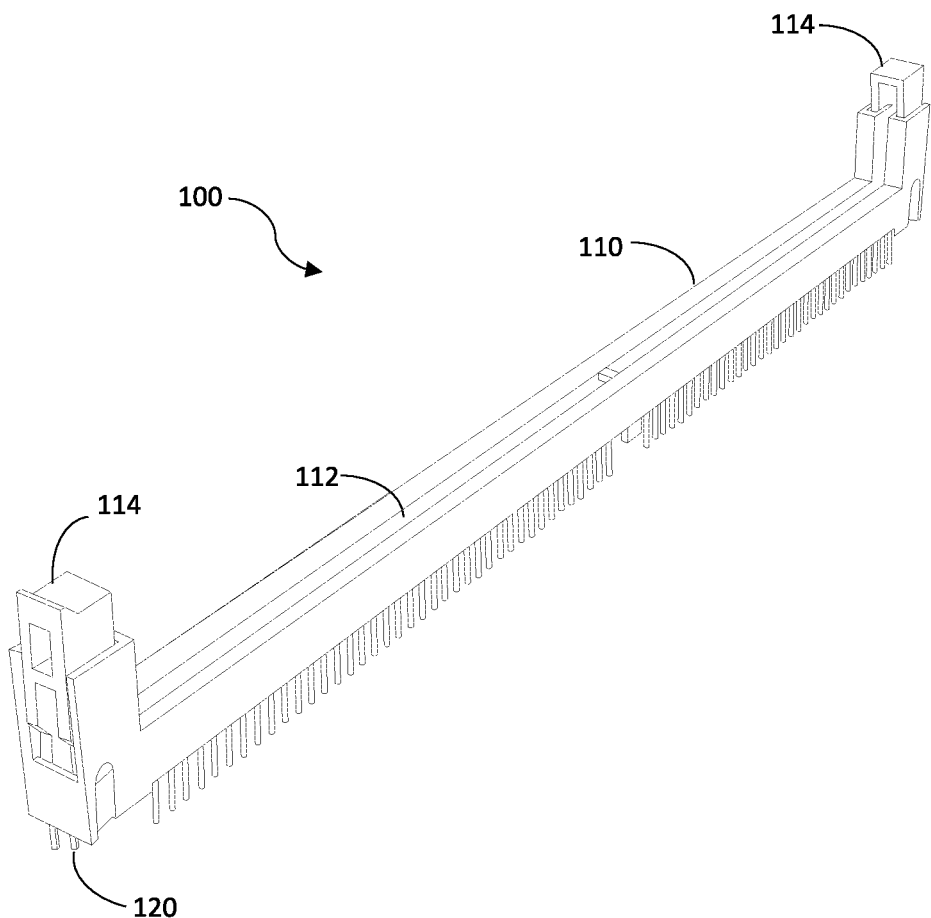
FIG. 1 shows an example connector for connecting a memory module to a PCB.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples disclosed herein are applicable to any memory technologies, such as DDR3 (Double Data Rate version 3, original release by JEDEC (Joint Electronic Device Engineering Council) on Jun. 27, 2007), DDR4 (DDR version 4, initial specification published in September 2012 by JEDEC), DDR4E (DDR version 4 extended), LPDDR3 (Low Power DDR version 3, JESD209-3B, August 2013 by JEDEC), LPDDR4 (LPDDR version 4, JESD209-4, originally published by JEDEC in August 2014), DDR5 (DDR version 5, currently in discussion by JEDEC), LPDDR5 (currently in discussion by JEDEC), or others or combinations of memory technologies, and technologies based on derivatives or extensions of such specifications. The JEDEC standards are available at www.jedec.org.

Examples are disclosed for an electrical connector (a connector for electrical connection) for connecting a circuit card to a substrate. The circuit card may be a memory module, such as a DIMM, a SIMM, an unbuffered DIMM (UDIMM), a small outline DIMM (SODIMM), a registered DIMM (RDIMM), a load reduced DIMM (LRDIMM), a micro DIMM, etc. The substrate may be a PCB, such as a motherboard. The connector may be compatible with any memory technologies. For example, the connector may be JEDEC standard-compatible connectors, such as a DDR3 240 pin connector, a DDR4 288 pin U/R/LR DIMM connector, a DDR4 260 pin SODIMM connector, a DDR5 288 pin connector, or any other types of connectors that currently exist or that may be developed in the future.

The connector includes a housing and a forklock. The housing is in an elongated shape and includes an elongated slot for accepting an edge of a circuit card therein. The forklock may be in a generally flat shape and include multiple (e.g. two) prongs. Two forklocks may be provided on each end of the housing. Alternatively, additional forklock(s) may be provided in the middle section of the housing. The forklocks extend from a bottom surface of the housing. In order to secure the connector to the substrate, the forklocks are inserted into the through holes formed in the substrate. In one example, the forklocks are rotated by a predetermined degree of angle about a longitudinal direction of the housing. For example, the forklocks are rotated 45 degrees about the longitudinal direction of the housing.

Examples will be explained with reference to a connector for connecting a memory module to a PCB. However, it should be noted that the examples disclosed herein are not limited to a connector for a memory module but may be applied to a connector for connecting any kind of circuit card to a substrate, such as a connector for connecting daughter boards to a motherboard, or the like.

FIG. 1 shows an example connector 100 (socket) for connecting a memory module to a PCB. The connector 100 includes a housing 110 and forklocks 120. The housing 110 is in an elongated shape and includes an elongated slot 112 therein for accepting an edge of a memory module. For examples, a DIMM may be inserted into the slot 112 and secured in place by a locking mechanism 114 provided in the connector 100. The forklocks 120 may be in a generally flat shape and include multiple (e.g. two) prongs. Two forklocks 120 may be extended from a bottom surface of the housing 110 on each end of the housing 110. Alternatively, there may be one or more additional forklocks extended in the middle section of the housing 110 as well.

Figure 2:
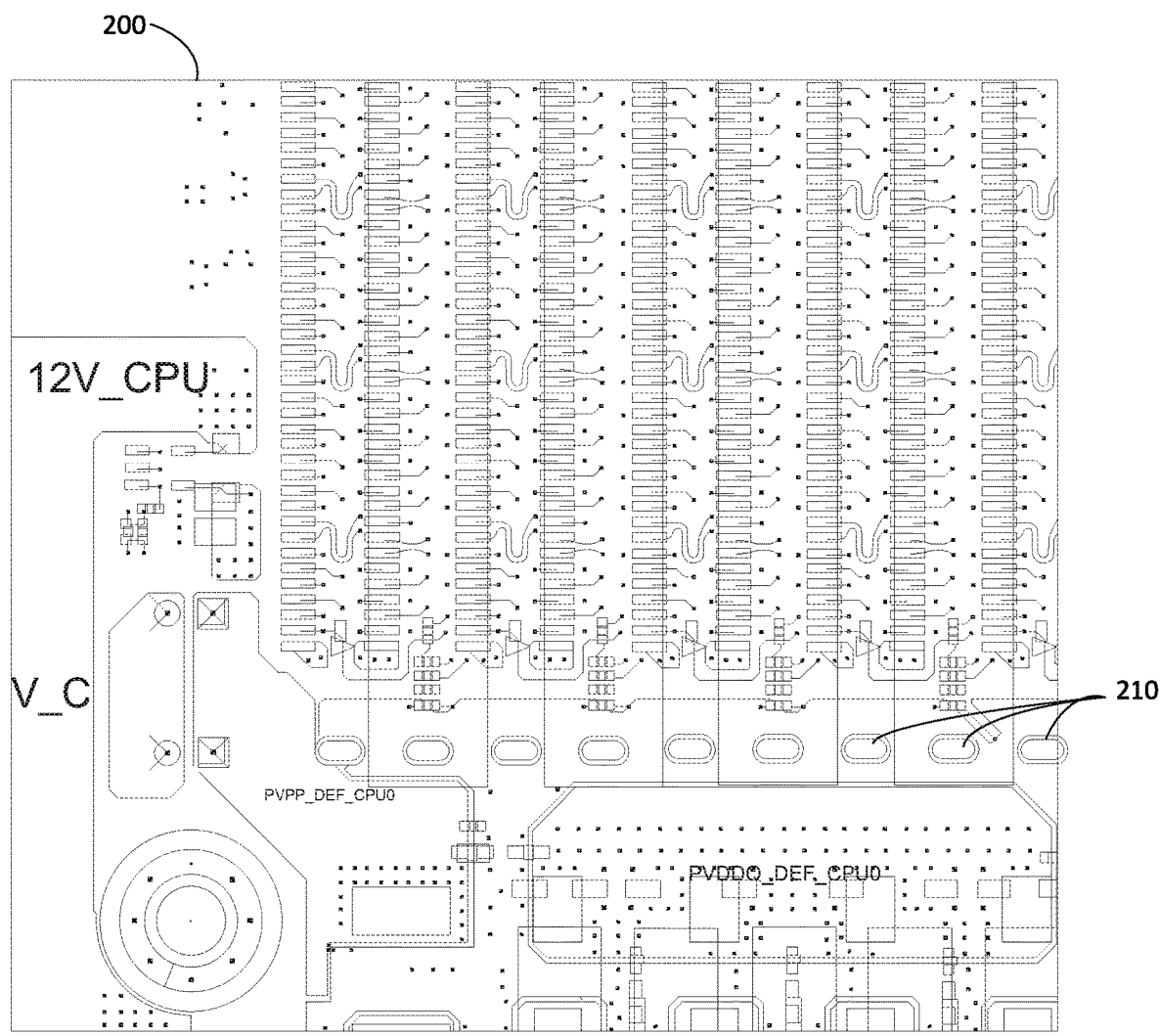
FIG. 2 shows an example PCB with through holes for connectors.

The connector 100 may be secured onto a PCB by inserting the forklocks 120 to through holes formed in a PCB. FIG. 2 shows an example PCB 200 with through holes 210 for connectors 100. Through holes 210 (mounting holes) are provided in a PCB 200 and the connector 100 is secured onto the PCB 200 by inserting the forklocks 120 into the through holes 210.

Figure 3A:
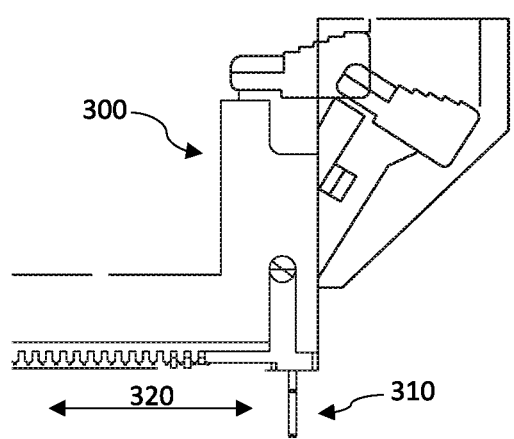
FIGS. 3A and 3B are front and side views of one end of a conventional connector, respectively.
Figure 3B:
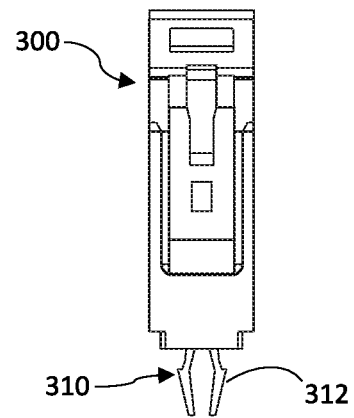
Figure 4:
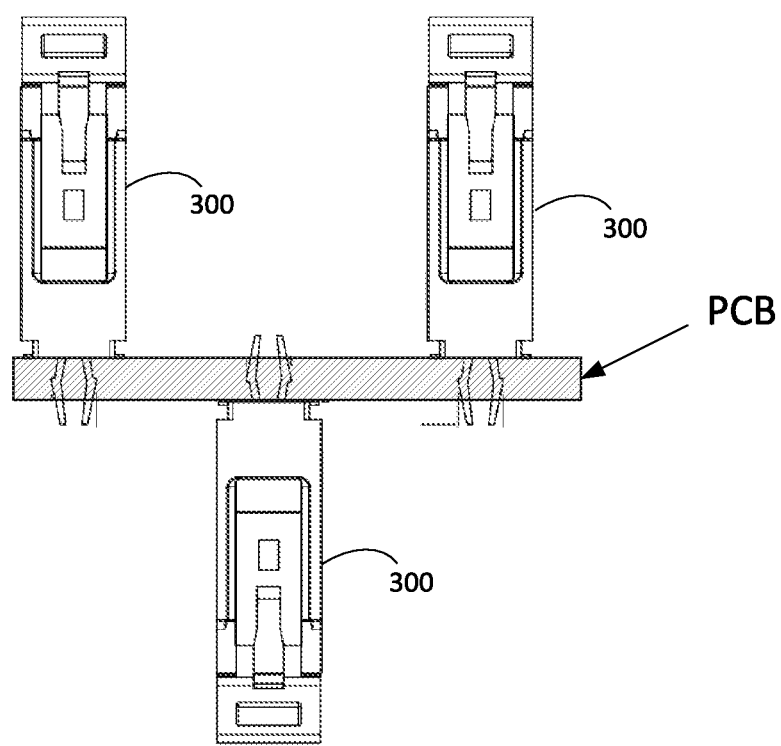
FIG. 4 shows conventional connectors installed on top and bottom surfaces of a PCB.

FIGS. 3A and 3B are front and side views of one end of a conventional connector 300, respectively. Conventionally, the forklocks 310 include two prongs 312 that are disposed perpendicularly to the longitudinal direction 320 of the housing. Therefore, when memory modules are placed on both sides of a PCB, there is a conflict between forklocks disposed on top and bottom surfaces of the PCB. Due to the conflict, the memory modules are placed in zig-zag on the top and bottom sides of the PCB as shown in FIG. 4. FIG. 4 shows conventional connectors 300 installed on top and bottom surfaces of a PCB. With the forklocks disposed perpendicularly to the longitudinal direction of the housing, two connectors 300 may not be installed at the same place on the top and bottom surfaces of the PCB.

In one example, the forklocks 120 are rotated by a predetermined degree of angle about the longitudinal direction 130 of the housing 110. For example, the forklocks 120 may be rotated by 45 degree about the longitudinal direction 130 of the housing 110.

Figure 5:
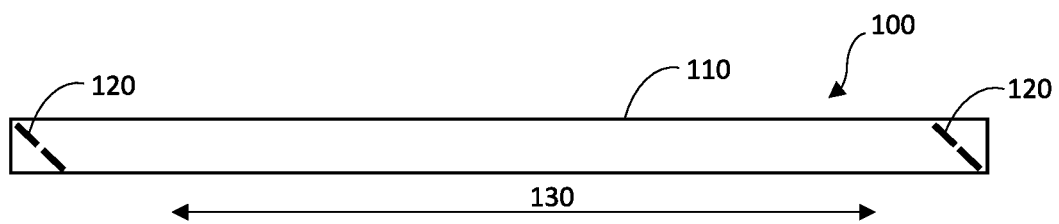
FIG. 5 is a schematic drawing of a bottom surface of the connector showing the 45-degree-rotated forklocks in accordance with one example.

FIG. 5 is a schematic drawing of a bottom surface of the connector 100 showing the 45-degree-rotated forklocks 120 in accordance with one example. The connector 100 includes a housing 110 and forklocks 120. The housing 110 is in an elongated shape and includes an elongated slot (not shown in FIG. 5) therein for accepting an edge of a memory module. The forklocks 120 may be rotated by a certain angle. In one example, the forklocks 120 may be rotated 45 degrees about the longitudinal direction 130 of the housing 110. In examples, the forklocks 120 may be rotated less than 90 degree about the longitudinal direction 130 of the housing 130. In other examples, the forlocks 120 may be rotated in 60 degree or less about the longitudinal direction 130 of the housing 130. In still other examples, the forlocks 120 may be rotated in 45 degree or less about the longitudinal direction 130 of the housing 130. In still further examples, a forklock 120 on one end may be parallel to the longitudinal direction 130 of the housing 110 (i.e. 0 degree rotation) and another forklock 120 on the other end may be perpendicular to the longitudinal direction 130 of the housing 110 (i.e. 90 degree rotation). There may be some leeway in the angle (e.g. the angle may be in a range of 44~46 degrees, or 43~47 degrees, or the like). Alternatively, the forlocks 120 may be rotated in any degree other than perpendicular to the longitudinal direction 130 of the housing 130. The forklocks 120 of connectors 100 mounted to a same through hole 210 on the top and bottom surfaces of a PCB may be perpendicular to each other. Therefore, if the forklocks 120 are rotated in an angle other than 45 degrees, two different (matching) types of connectors with forklocks perpendicular to each other may be used on the top and bottom surfaces of the PCB.

Figure 6:
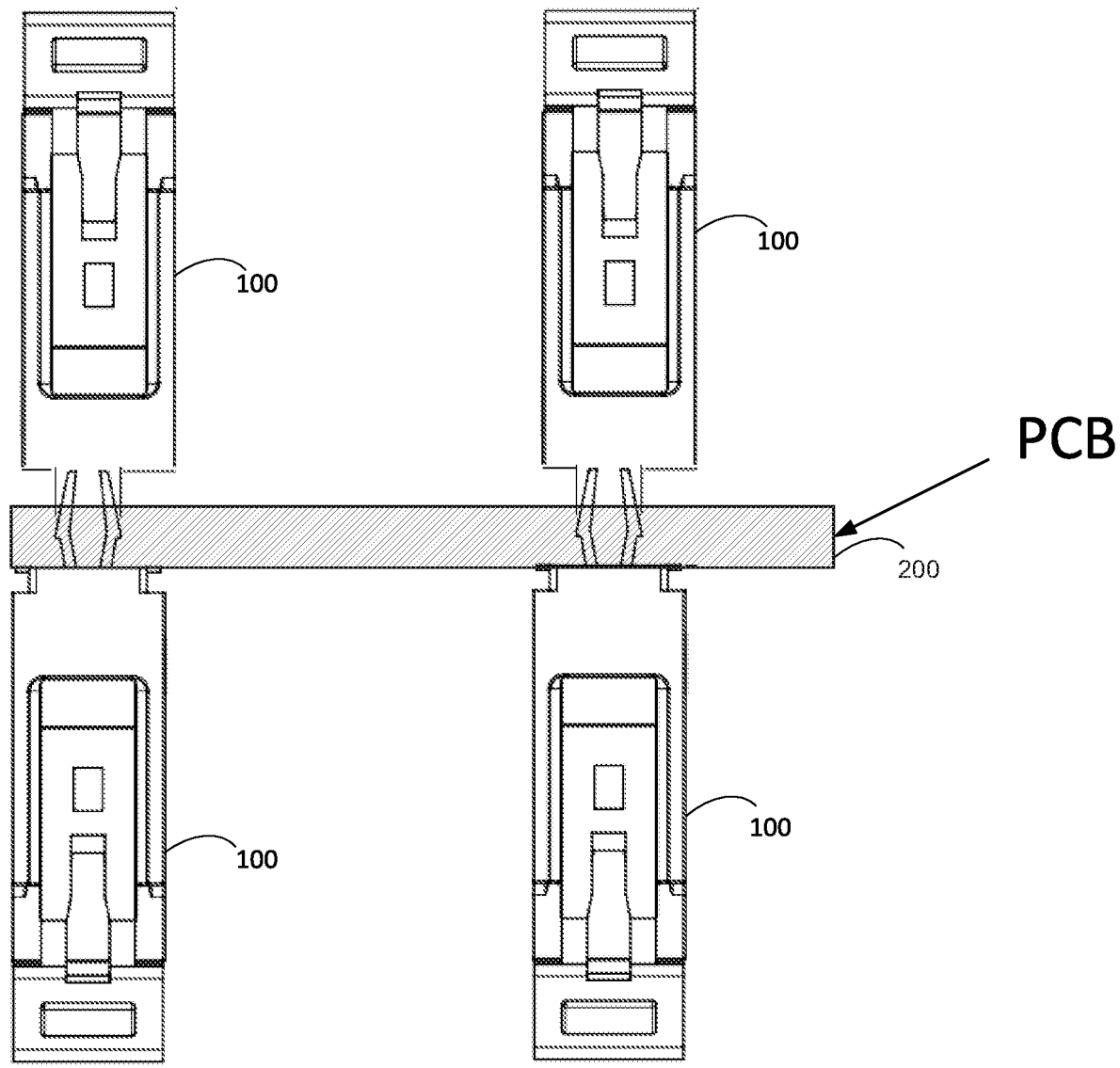
FIG. 6 shows connectors installed on both sides of a PCB in accordance with one example.

FIG. 6 shows connectors installed on both sides of a PCB in accordance with one example. As the forklocks 120 of a connector are rotated, the connectors 100 may be installed on both sides of the PCB at the same location (i.e. mirror-placed) as shown in FIG. 6.

FIG. 7A illustrates a footprint of a forklock of a conventional connector 300 installed on one side of a PCB, and FIG. 7B shows a footprint of forklocks of connectors 100 installed on both sides of a PCB at the same location. As the forklocks are 45 degree rotated (as an example), two connectors 100 may be mounted at the same through hole on both sides of a PCB without a conflict.

With the structure of a connector 100 in accordance with the examples disclosed herein, DIMM pitch (the distance between DIMM modules on the PCB) may be reduced compared to the conventional structure (e.g. from 378 mils to 310 mils), and memory data and data strobe trace lengths on the PCB may be reduced (e.g. memory data request (DQ) and data request strobe (DQS) trace lengths reduced from 4.5 inches to 4 inches). This can reduce the dimensions of the system, which can save cost and improve system interface and memory performances. It is also helpful for high density system design to support more memories.

Figure 8:
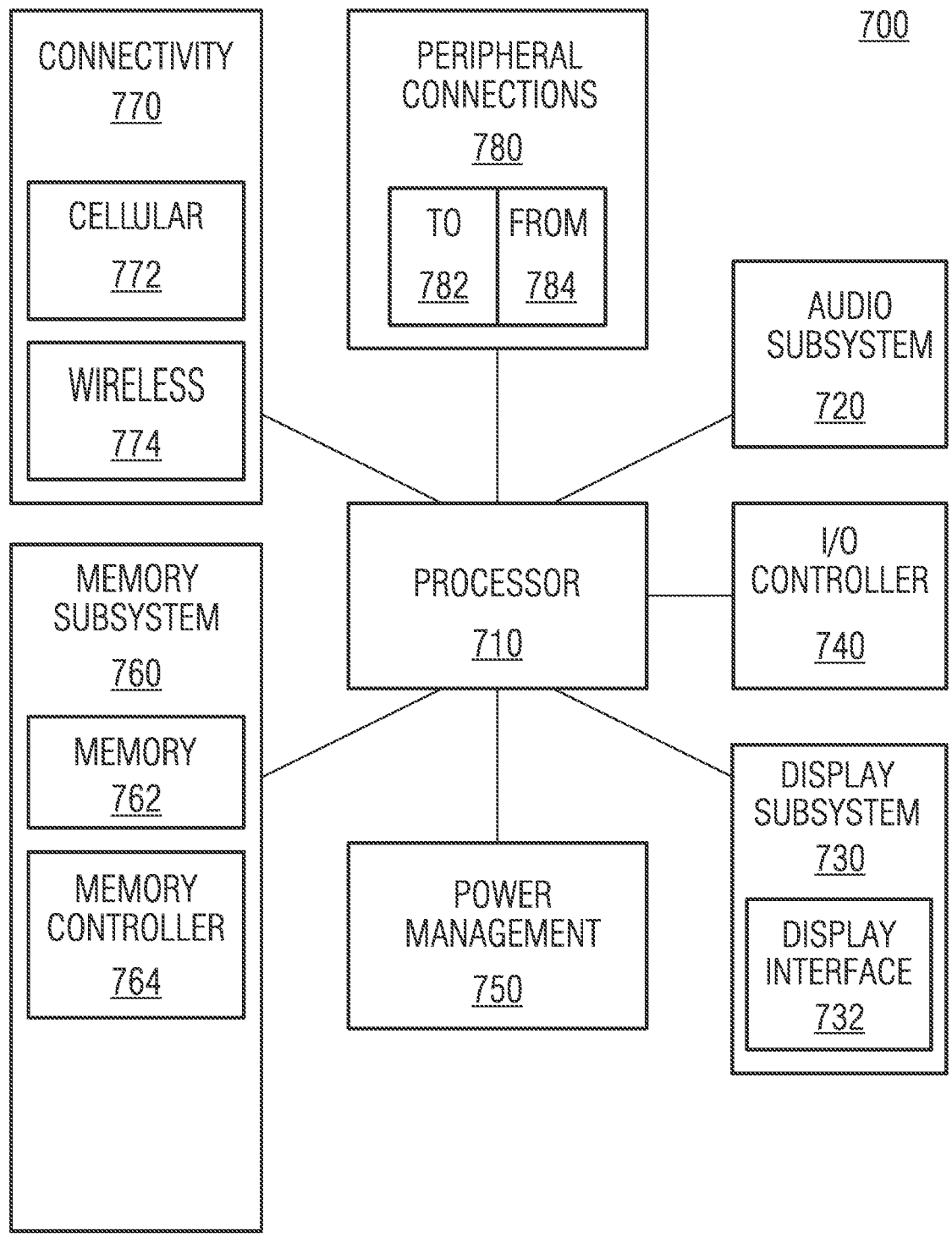
FIG. 8 is a block diagram of an example device, for example a device, in which the connector may be used.

FIG. 8 is a block diagram of an example device in which the connector 100 may be used. For example, device 700 may represent a computing device, such as personal computers, workstations, servers, or the like. It will be understood that certain components are shown generally, and not all components of such a device are shown in device 700, and some of the components of the device 700 may not be included. It should be noted that some of the components shown in FIG. 8 may be integrated into a single chip or multiple chips. For example, some or all of memory subsystem 760, power management 750, and/or processor 710 may be integrated into a single chip or multiple chips.

Device 700 includes a processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one example, device 700 includes an audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one example, a user interacts with device 700 by providing audio commands that are received and processed by processor 710.

A display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one example, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra-high definition or UHD), or others.

An I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include two or more levels of main memory, wherein a first level of main memory (near memory) stores indirection information of a second level of main memory (far memory). The second level of main memory may include wear leveled memory devices, such as nonvolatile (state does not change if power to the memory device is interrupted) memory, for example. The first level of main memory may include volatile (state is indeterminate if power to the memory device is interrupted) memory devices, such as DRAM memory, for example. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 may include a scheduler to generate and issue commands to memory device 762. Memory controller 764 may include near memory controller functionalities as well as far memory controller functionalities. Alternatively, memory controller 764 may be included in processor 710 rather than in memory subsystem 760.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 may include multiple different types of connectivity. To generalize, device 700 is illustrated with cellular connectivity 772 and wireless connectivity 774, etc. Connectivity 770 may also include wired connectivity. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is an electrical connector to connect a circuit card to a substrate. The connector may include a housing in an elongated shape including a slot to accept an edge of the circuit card and forklocks extended from a bottom surface of the housing on each end of the housing, wherein the forklocks are inserted into through holes formed in the substrate to secure the housing to the substrate. The forklocks may be rotated by a predetermined degree of angle about a longitudinal direction of the housing.

Example 2 is the electrical connector of example 1, wherein the forklocks are rotated 45 degrees about the longitudinal direction of the housing.

Example 3 is the electrical connector as in any one of example 1-2, wherein the circuit card is a memory module.

Example 4 is the electrical connector of example 3, wherein the memory module is a dual in-line memory module.

Example 5 is the electrical connector as in any one of examples 1-2, wherein the substrate is a printed circuit board.

Example 6 is the electrical connector as in any one of examples 1-2, wherein the circuit card is a daughter board and the substrate is a mother board.

Example 7 is a printed circuit board. The printed circuit board may include a substrate board including a printed circuit and through holes and a plurality of connectors for one or more memory modules. A set of connectors may be mirror-placed on both surfaces of the substrate board at a same location with a same set of through holes.

Example 8 is the printed circuit board of example 7, wherein each connector includes a housing in an elongated shape including a slot for accepting an edge of a memory module, and forklocks extended from a bottom surface of the housing on each end of the housing. The forklocks are inserted into the through holes formed in the substrate board to secure the housing to the substrate board, and the forklocks may be rotated by a predetermined degree of angle about a longitudinal direction of the housing.

Example 9 is the printed circuit board of example 8, wherein the forklocks are rotated 45 degrees about the longitudinal direction of the housing.

Example 10 is the printed circuit board as in any one of examples 8-9, wherein the memory module is a dual in-line memory module.

Example 11 is a memory connector for connecting a memory module to a printed circuit board. The memory connection may include a means for housing an edge of the memory module, and a means for securing the housing means to the printed circuit board. The securing means is configured such that two memory connectors can be installed from both surfaces of the printed circuit board at a same location.

Example 12 is the memory connector of example 11, wherein the securing means is a forklock extended from a bottom surface of the housing means and the forklock is rotated by a predetermined degree about a longitudinal direction of the housing means.

Example 13 is the memory connector of example 12, wherein the forklock is rotated 45 degrees about the longitudinal direction of the housing means.

Example 14 is the memory connector as in any one of examples 11-13, wherein the memory module is a dual in-line memory module.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP)

hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An electrical connector to connect a circuit card to a substrate, comprising:
a housing in an elongated shape including a slot to accept an edge of the circuit card; and
forklocks extended perpendicularly from a bottom surface of the housing, wherein the forklocks are inserted into through holes formed in the substrate to secure the housing to the substrate,
wherein the forklocks are in a flat shape and at least one of the forklocks are rotated in a degree other than 90 degrees about a longitudinal direction of the housing.

2. The electrical connector of claim 1, wherein the circuit card is a memory module.

3. The electrical connector of claim 2, wherein the memory module is a dual in-line memory module.

4. The electrical connector of claim 1, wherein the substrate is a printed circuit board.

5. The electrical connector of claim 1, wherein the circuit card is a daughter board and the substrate is a mother board.

6. A printed circuit board comprising:
a substrate board including a printed circuit and through holes, wherein the substrate board is a flat board having a top surface and a bottom surface; and
a plurality of connectors for one or more memory modules, wherein a pair of connectors are mirror-placed on both the top surface and the bottom surface of the substrate board at a same location, wherein a pair of perpendicular through holes are formed at the same location of the substrate board for mounting one connector from the top surface and another connector from the bottom surface,
wherein each connector comprises:
a housing in an elongated shape including a slot for accepting an edge of a memory module; and
forklocks extended perpendicularly from a bottom surface of the housing, wherein the forklocks are inserted into the through holes formed in the substrate board to secure the housing to the substrate board,
wherein the forklocks are in a flat shape and at least one of the forklocks are rotated in a degree other than 90 degrees about a longitudinal direction of the housing.

7. The printed circuit board of claim 6, wherein the memory module is a dual in-line memory module.

8. A memory connector for connecting a memory module to a printed circuit board, the printed circuit board being in a flat shape and having a top surface and a bottom surface, comprising:
a means for housing an edge of the memory module; and
a means for securing the housing means to the printed circuit board, wherein the securing means is configured such that two memory connectors can be installed from both the top surface and the bottom surface of the printed circuit board at a same location,
wherein the securing means is a forklock extended perpendicularly from a bottom surface of the housing means and the forklock is in a flat shape and at least one of the forklocks are rotated in a degree other than 90 degrees about a longitudinal direction of the housing means.

9. The memory connector of claim 8, wherein the memory module is a dual in-line memory module.

* * * * *